United States Patent [19]

Weigand et al.

[11] 4,342,983

[45] Aug. 3, 1982

[54] DYNAMICALLY CALIBRATED SUCCESSIVE RANGING A/D CONVERSION SYSTEM AND D/A CONVERTER FOR USE THEREIN

[75] Inventors: Benjamin F. Weigand, Catonsville; John W. Frech, Baltimore, both of Md.

[73] Assignee: Westinghouse Electric Corp., Pittsburgh, Pa.

[21] Appl. No.: 176,625

[22] Filed: Aug. 11, 1980

[51] Int. Cl.³ .......................................... H03K 13/02
[52] U.S. Cl. ...................... 340/347 CC; 340/347 AD; 340/347 DA
[58] Field of Search ................. 340/347 CC, 347 AD, 340/347 DA; 324/130; 328/162; 364/571

[56] References Cited

U.S. PATENT DOCUMENTS

| | | | |
|---|---|---|---|
| 3,365,713 | 1/1968 | Avignon | 340/347 CC |
| 3,646,586 | 2/1972 | Kurz | 340/347 AD |
| 3,816,825 | 6/1974 | Kaneko | 340/347 AD |
| 3,956,746 | 5/1976 | Lisle | 340/347 AD |
| 3,982,241 | 9/1976 | Lipcon | 340/347 CC |
| 4,081,801 | 3/1978 | Thomas | 340/347 AD |
| 4,119,960 | 10/1978 | Hill | 340/347 AD |
| 4,143,361 | 3/1979 | Tammes | 340/347 CC |
| 4,193,066 | 3/1980 | Morrison | 340/347 CC |
| 4,194,186 | 3/1980 | Morrison | 340/347 AD |
| 4,222,107 | 9/1980 | Mrozowski | 364/571 |

OTHER PUBLICATIONS

Croisier, "IBM Technical Disclosure Bulletin", vol. 18, No. 8, Jan. 1976, pp. 2538-2539.

Primary Examiner—Charles D. Miller
Attorney, Agent, or Firm—W. E. Zitelli

[57] ABSTRACT

One aspect of the present invention provides for apparatus for dynamically calibrating the internal offsets of the various range conversion paths as well as the overall offset of a successive ranging A/D conversion system over time and temperature variations. More specifically, this apparatus includes at least two time-gated integrator circuits which are respectively coupled to each of the range conversion paths of the conversion system. Each integrator is operative at predetermined times to generate a corresponding compensating signal in response to the digital code of one of the path conversion results. The compensating signals are used to dynamically calibrate the internal and overall offsets of the A/D conversion system. Further included in the apparatus are switching devices disposed at the input and feedback paths of the system to provide for appropriate system conditions at the predetermined calibration times. Another aspect of the present invention is directed to a D/A converter which may be disposed in at least one of the feedback paths of the system. The D/A converter includes apparatus for self-compensating the conversion inaccuracies thereof. An additional aspect of the present invention is directed to extending the resolution of the D/A converter to at least one additional bit, thus doubling the resolution thereof.

15 Claims, 13 Drawing Figures

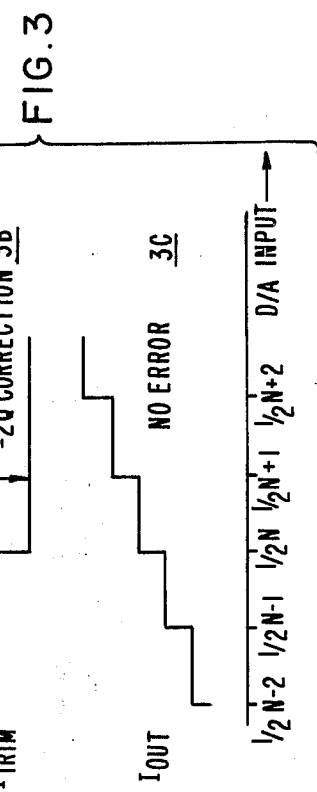
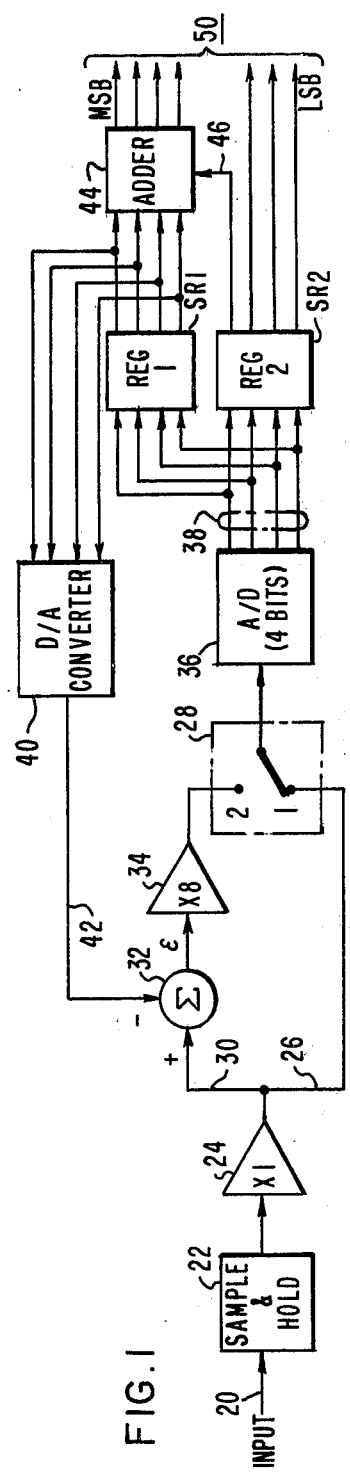
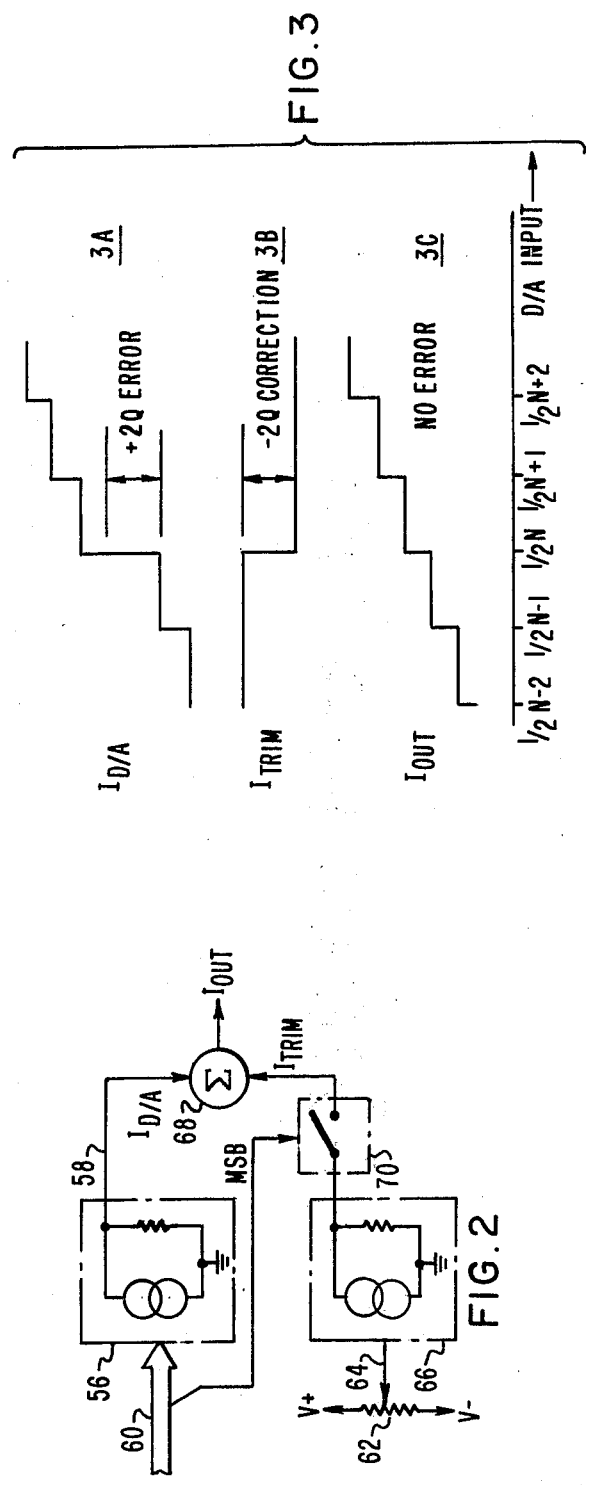

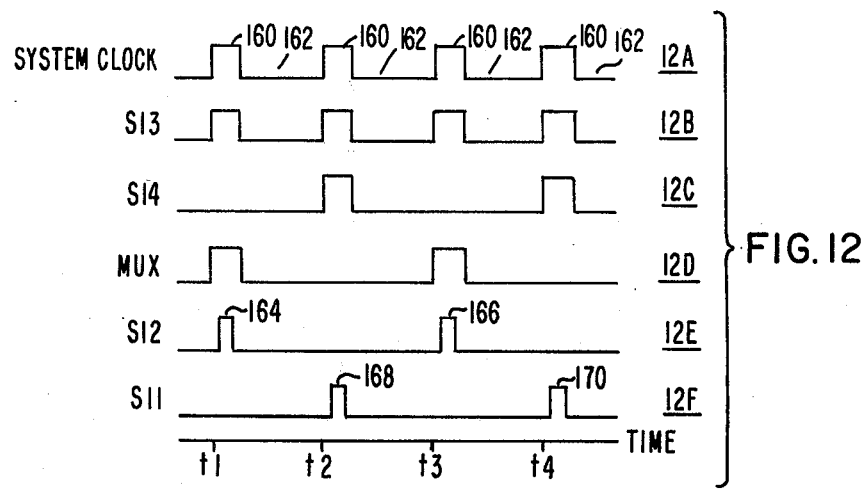
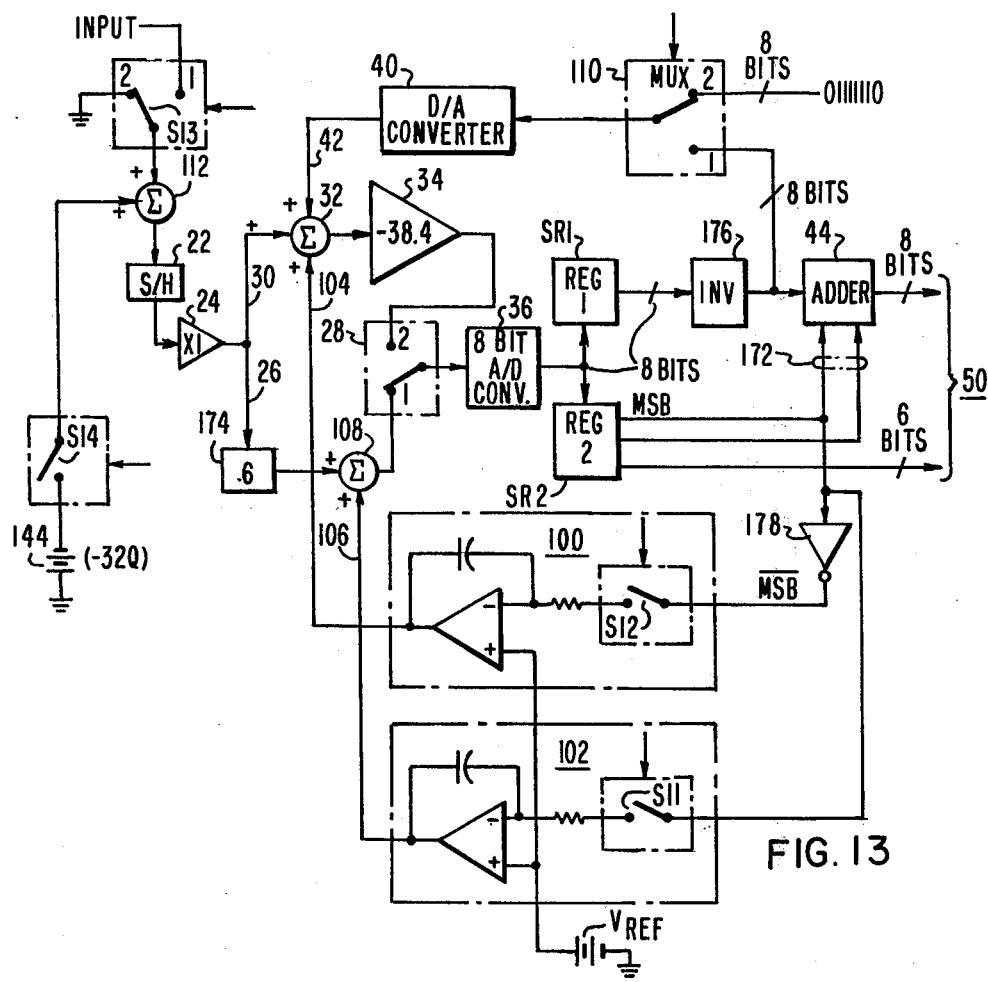

DYNAMICALLY CALIBRATED SUCCESSIVE RANGING A/D CONVERSION SYSTEM AND D/A CONVERTER FOR USE THEREIN

GOVERNMENT CONTRACT CLAUSE

The invention herein described was made in the course of or under a contract or subcontract thereunder with the Department of the Air Force bearing Contract No. F19628-70-C-0218.

BACKGROUND OF THE INVENTION

The present invention relates broadly to the field of combining analog and digital signal processing, and more specifically, to an analog-to-digital (A/D) converter of the successive ranging type which comprises apparatus for expanding the performance of a digital-to-analog (D/A) converter included therein; and apparatus for dynamically calibrating the internal offsets of the various range conversion paths as well as the overall offset of the A/D converter over time and temperature variations.

Modern day high performance radar receivers and processors generally include successive ranging type analog-to-digital converters (A/D) with increasing dynamic range and accuracy requirements to assist in the detection and tracking of small targets in the presence of large clutter and larger targets. Since it is generally understood that the ultimate A/D converter transfer characteristics can be no better than the transfer characteristics of the digital-to-analog converter included therein, techniques for expanding the performance of this digital-to-analog converter (D/A) to meet the specifications of the present high performance airborne radars is believed of paramount importance. In addition, most successive ranging type A/D converters encounter troublesome offset errors generally between subranging conversion paths. Presently, these A/D converter offsets may be eliminated by adjustment at a plurality of separate calibration locations at some point in time and temperature. However, these separate calibrations appear to be ineffective to correct for component value drifts dynamically occurring over time and temperature which have a tendency to produce drifting offsets between the conversion paths. Present approaches like a-priori predictions, for example, have attempted to resolve the offset drift phenomenon, but only over limited dynamic performance ranges of the A/D converter. What appears to be needed is an active calibration approach which could eliminate the necessity of cumbersome individual calibration points and correct for offset drifts over a wider dynamic performance range of the A/D converter.

For a better understanding of the aforementioned problems, a description of a typical successive ranging A/D converter, like the one shown schematically in the block diagram embodiment of FIG. 1, will be provided. This particular A/D converter embodiment includes a feedback path with a conventional D/A converter included therein and first and second conversion paths with a subranging gain element included in the second conversion path. In more detail then, referring to FIG. 1, an analog signal 20 is input to a conventional sample and hold circuit 22, the output of which is coupled to the input of a typical unity gain type buffer amplifier 24. The output of amplifier 24 is coupled over a first conversion path 26 to the first position of a conventional single pole double throw analog switch 28 and is also coupled over a second conversion path 30 to the second position of the analog switch 28.

Included in the second conversion path is an adder circuit 32 in cascade with a typical non-inverting amplifier 34 which may be adjusted to a predetermined channel gain. The pole connection of the analog switch 28 may be coupled to a basic A/D converter 36 which for the present embodiment is of the flash converter variety resolving the analog input signal into four bits of binary code provided over its output lines 38. The lines 38 are parallel coupled to the inputs of two storage registers SR1 and SR2. The output of storage register SR1 is fed back to the second conversion path 30 through a conventional D/A converter 40 via line 42 into the negative input of the summer 32 wherein it is subtracted from the analog input signal from the amplifier 24.

In the present embodiment, the outputs of the registers SR1 and SR2 are overlapped in an addition operation performed by a conventional 4-bit adder 44 such that the most significant bit of the SR2 output is added to the least significant bit of the SR1 output. The resulting 7-bit output word is provided over signal lines shown at 50.

In operation then, the input analog signal at 20 is sampled and held for a predetermined time by the circuit at 22. During this predetermined hold time, the analog input signal 20 is buffered by the amplifier 24 and provided to the two conversion paths 26 and 30. The analog switch 28 is first switched to position 1 to allow the basic A/D 36 to convert the analog signal provided over the first conversion path 26 to a 4-bit digital code which is coupled over lines 38 to register SR1. The register SR1 stores the contents of the first conversion until the second conversion is performed and the composite output word at 50 is formed. The first conversion 4-bit word is provided back to the summer 32 via D/A converter 40 and line 42. In the summer 32, the fed back analog signal is subtracted from the input analog signal to provide an error signal $\epsilon$ in the conversion path 30 which is multiplied by the gain of the amplifier 34 and provided to switch position 2 of 28. The analog switch 28 is then switched to position 2 to allow the basic A/D converter 36 to convert the amplified signal of the second channel 30 into another 4-bit code which is provided to the shift register SR2. The results of the two conversions stored in the shift registers SR1 and SR2, respectively, are added with the aforementioned one bit overlap in the adder 44 to derive the 7-bit output word at 50.

Because of the one bit overlap, the 4-bit code of the register SR1 is merely shifted three bits upward or, in other words, multiplied by 8. Thus, the error $\epsilon$ formed at the summer 32 will be within 8 quanta (q) wherein 1 quanta is the analog value represented by one least significant bit of the 7-bit output word at 50. In order to bring this error $\epsilon$ quantity to half-scale range of the basic A/D converter 36, as is generally the case, it may be amplified by a channel gain of 8 in the amplifier 34 as shown in FIG. 1.

It is understood that the use of 4 bits for the conversions resulting in a 7-bit output word was provided hereabove for reasons of simplifying the description of operation of the exemplified embodiment. In general, it is expected that the conversions may be performed with the resolution of 8 bits with the more probable formation of a 14 or 15-bit output word. In these cases, then, the D/A converter 40 will be an 8-bit converter, and in addition, the gain in amplifier 34 of the second conversion path may be increased to 64 or even possibly 128.

Concentrating now on the performance of the D/A converter, in particular, a functional representation of a typical D/A converter with a current output is shown in block 56 of FIG. 2. The current $I_{D/A}$ provided over the output line 58 from the converter 56 is the analog equivalent of a digital signal 60 provided to the inputs thereof. However, it should be understood that linearity errors in the transfer characteristics of a D/A converter typically may occur as the input code over signal line 60 passes through the transition of one of the more significant bit changes (i.e. 01111111→10000000, for example), due to the fact that a proportionally small error in a more significant bit can cause non-linearities of a size comparable to the least significant bit (LSB) of the converter.

A typical illustration of this phenomenon is shown in the waveform 3A of FIG. 3. For example, as the input digital code over lines 60 to the converter 56 passes through the transition of its most significant bit (MSB) (i.e. the midpoint of the transfer characteristic), it may exhibit the non-linearity as shown in the waveform 3A. In this example, the D/A non-linearity produces an error of 2 quanta, denoted by 2Q, through the code transition between (N/2)−1 and N/2, where N is the highest digital code obtainable over the digital lines 60.

It is understood that additional non-linearities may also exit in the transfer characteristic of the D/A converter during the second MSB transition which occurs at approximately ¼-scale intervals, and even the third MSB or fourth MSB transitions and so on down the line. However, since an error on the order of one LSB in the MSB represents $(\frac{1}{2}^{n-1}) \times 100\%$ of the MSB size, but represents $(\frac{1}{2}^{n-2}) \times 100\%$ of the second MSB size, wherein n equals total number of bits in the digital code, it can be shown that the required bit accuracy becomes less stringent as the transition bit becomes less significant. Consequently, non-linearity of an "off-the-shelf" N-bit D/A converter may usually be corrected externally to within the desired specifications by trimming only the most significant bits, rather than all the bits or all of the $2^n$ code levels.

In the examples exhibited in FIGS. 2 and 3, the non-linearity error of the most significant bit may be compensated for by introducing a trim current at the time when the MSB becomes a "one". One known simple way of adjusting the trim current, denoted in FIG. 2 as $I_{TRIM}$, is by way of a potentiometer 62 which has its wiper arm 64 coupled to a conventional current source 66. The output of the current source 66 is coupled to a summing junction 68 through a single-pole-single-throw analog switch 70 which is controlled by the MSB of the digital code 60. As illustrated by the waveform 3B of FIG. 3, the potentiometer 62 may be adjusted to provide a trim current proportional to −2 quanta (−2Q) which may be subtracted from the converter current $I_{D/A}$ at the summing junction 68 when the MSB of the digital code 60 is activated. The resulting output current, denoted by $I_{out}$, then will exhibit no substantial linearity error through the transition of the MSB as illustrated by the waveform 3C of FIG. 3. While this appears to be an adequate solution, this simple permanent adjustment is not capable of tracking the drift of the various components of the D/A converter which may produce non-linearities over any reasonable operational temperature range and even possibly in time. Evidently, some type of dynamic trimming of the D/A converter is needed to track and compensate for these drift errors with time and temperature.

Referring now to the offset drift errors between the conversion paths of a successive ranging A/D converter, any drift in component values occurring up to the output of the buffer amplifier 24 generally appears only as a drift in overall input offset. However offset drifts occurring along both conversion paths in an uncorrelated relationship may cause the level of the second conversion range to shift away from its ideal ¼ to ¾ scale centered range setting with respect to the conversion range of the basic A/D converter 36. Now if this offset drift becomes enough to throw the second conversion range either below or above scale, say, −¼ to ¼ scale or ¾ to 1¼ scale, for example, then the basic A/D converter 36 may not provide accurate conversions in those regions exceeding its possible conversion range, and repetitive discontinuities in the transfer characteristics thereof may result.

Typical offset drifts of the conversion paths may occur in the analog switch 28, the analog amplifier 34, the summer 32 and even the input circuitry of the basic A/D converter 36. In fact, any offset not appearing equally in both conversion paths 26 and 30 may throw the second conversion range off scale wherein, as previously stated, repetitive discontinuities will occur. Moreover, while the control of the subrange offset drift appears essential, the control of the overall offset drive is also desirable to maintain full dynamic range of the overall A/D converter system as well as to provide a controllable characteristic where prospective problem areas due to the successive ranging process are predictable. Accordingly, tightly controlled offset drift appears very important if the direct-coupled characteristics of the A/D converter are to be repeatable. Offset drifts occurring both in the subrange paths and in the input sample-and-hold and buffer circuits 22 and 24, respectively, may effect the overall A/D conversion accuracy.

SUMMARY OF THE INVENTION

A successive ranging analog-to-digital conversion system includes at least two analog range conversion paths coupled commonly to an analog input of the system through which an analog input signal may be conducted commonly to each of the paths. Each path has a gain respectively associated with the conversion range thereof. At least one analog-to-digital converter converts each of the gain ranged analog signals of the conversion paths to form coded words respectively corresponding thereto, each resulting word having a predetermined number of significantly ordered bits. The system includes at least one feedback path for subtracting the conversion results of a first conversion path from the common analog input signal of a second conversion path to effect a difference analog signal which is adjusted in gain in the second conversion path according to the range gain thereof to form the gain ranged analog signal associated therewith. A digital circuit means combines the resulting digitally coded words of the conversion paths to form a composite digitally coded output signal which is the approximate quantized digital equivalent of the analog input signal.

In accordance with one aspect of the present invention, apparatus for dynamically reducing offset errors associated with the successive ranging A/D conversion system is included therein to improve the conversion transfer characteristics thereof. Included is a first switching means coupled to the analog input of the conversion system for introducing a first reference signal, preferably equivalent to a zero potential, as the analog input signal at first predetermined times and a second reference signal, preferably based on the gain range of the second conversion path, as the analog input signal at second predetermined times. A second switching means is provided for rendering the at least one feedback path inoperative at the first predetermined times and concomitantly subtracting the common analog input signal of the second conversion path with a fixed predetermined signal. Also included are first and second integrator circuits which are responsive to the digital code of the resulting conversion word of the second conversion path at the first and second predetermined times, respectively, to generate corresponding first and second compensating signals. Additionally included are first and second circuit means for coupling the first and second compensating signals into the second and first conversion paths, respectively.

In one embodiment, the conversion code of the resulting digital words of the A/D conversion system include a most significant bit having binary level states. In this embodiment, the first and second integrator circuits are responsive to the binary state of the most significant bit of the resulting conversion words of the second conversion path at the first and second predetermined times, respectively, to generate their first and second respective compensating signals.

In accordance with another aspect of the present invention, a digital-to-analog converter suitable for embodiment into a successive range in A/D conversion system includes apparatus for self-compensation of conversion inaccuracies. The apparatus includes a first circuit which is responsive to the digitally coded input signal of a digital-to-analog converter circuit to add a compensating analog signal to the analog output signal of the converter circuit to yield a compensated analog output signal. A second circuit of the apparatus is operative, at predetermined times, for causing the digitally coded input signal of the converter circuit to switch between a predetermined pair of consecutive digital codes to render a corresponding transitional difference in the compensated analog outer signal. Further included are a third circuit which measures the rendered transitional differences and generates a difference signal representative of each; and an integrating circuit which is responsive to the difference signals for a prespecified interval at the predetermined times, to generate the compensating signal.

In an alternate embodiment, the second circuit includes a fourth circuit which is operative to cause the digitally coded input signal to switch between a plurality of predetermined pairs of consecutive digital codes to render the transitional difference for each of the predetermined pairs of the plurality, each predetermined pair of the plurality being switched at corresponding selected ones of the predetermined times. Accordingly, the third circuit is operative to measure each rendered transitional difference and to generate a plurality of difference signals respectively corresponding thereto. Moreover, the integrating circuit includes a time-gated integrator for each generated difference signal of the plurality, which is responsive to the generated difference signal associated therewith, for a prespecified interval of said corresponding selected predetermined times to generate a corresponding compensating signal. Furthermore, the first circuit includes a plurality of analog switches coupled correspondingly to the outputs of the plurality of time gated integrators and governed by the digital code of said input words of the converter to selectively sum, at times, said generated compensating signals to the analog output signal of the converter to yield the compensated analog output signal.

Preferably, in the one embodiment, the digitally coded input words of the digital-to-analog converter circuit may be binary coded, in which case, the first circuit may be responsive to the most significant bit of the binary coded input words to add the compensating signal to the analog output signal, and furthermore, the second circuit may be operative to cause the binary coded input signal to switch between a binary coded word representative of one-half full scale minus one least significant bit and a binary coded word representative of onehalf full scale to render a corresponding transitional difference in the compensated analog output signal of the digital-to-analog converter circuit at the predetermined times.

In this same regard, if the alternate embodiment also included binary coded words, then the second circuit may also include circuitry which is operative to cause the binary coded digital input signal to switch between at least three consecutive pairs of binary coded words to render corresponding first, second, and third transitional differences in the compensated analog output signal at first, second, and third predetermined times, respectively. Accordingly, the third circuit is operative, in this embodiment, to measure the rendered first, second, and third differences to generate respectively corresponding first, second, and third difference signals representative thereof. And, the integrating circuit includes at least a first time gated integrator circuit being responsive to the first difference signal for a prespecified interval, at the first predetermined times, to generate a first compensating signal; a second time-gated integrator circuit being responsive to the second difference signal for a prespecified interval, at the second predetermined times, to generate a second compensating signal; and a third time gated integrator circuit being responsive to the third difference signal for a prespecified interval at the third predetermined time to generate a third compensating signal.

Still in connection with this same embodiment, the first circuit includes at least three time-gated analog switches which are responsive to the binary coded digital input signal to add selectively the first, second, and third compensating signals to the analog output signal of the digital-to-analog converter circuit. In one case, the prespecified transitional points may include the most, second most, and third most significant bits, wherein the three time-gated analog switches of the first circuit are responsive, respectively, to the most, second most, and third most significant bits to add selectively the first, second, and third compensating signals, respectively, to the analog output signal of the digital-to-analog converter circuit.

BRIEF DESCRIPTION OF THE DRAWINGS

FIG. 1 is a block diagram schematic of a typical successive ranging A/D converter;

FIG. 2 depicts a functional schematic of a conventional current type D/A converter including compensation apparatus;

FIG. 3 illustrates in the waveforms 3A, 3B, and 3C, the compensation of a linearity error in the transfer characteristics of a D/A converter system similar to the one shown in the embodiment of FIG. 2;

FIG. 12 includes exemplary time waveforms 12A through 12F which are used to describe at least one operational mode of the successive ranging A/D conversion system embodiment of FIG. 11 in accordance with the offset error reduction aspect of the present invention; and FIG. 13 depicts a block diagram schematic of an alternate embodiment of a A/D conversion system suitable for emboding the inventive aspects regarding the dynamic reduction of offset errors which may exist in the A/D conversion process thereof.

DESCRIPTION OF THE PREFERRED EMBODIMENT

Figure 4:
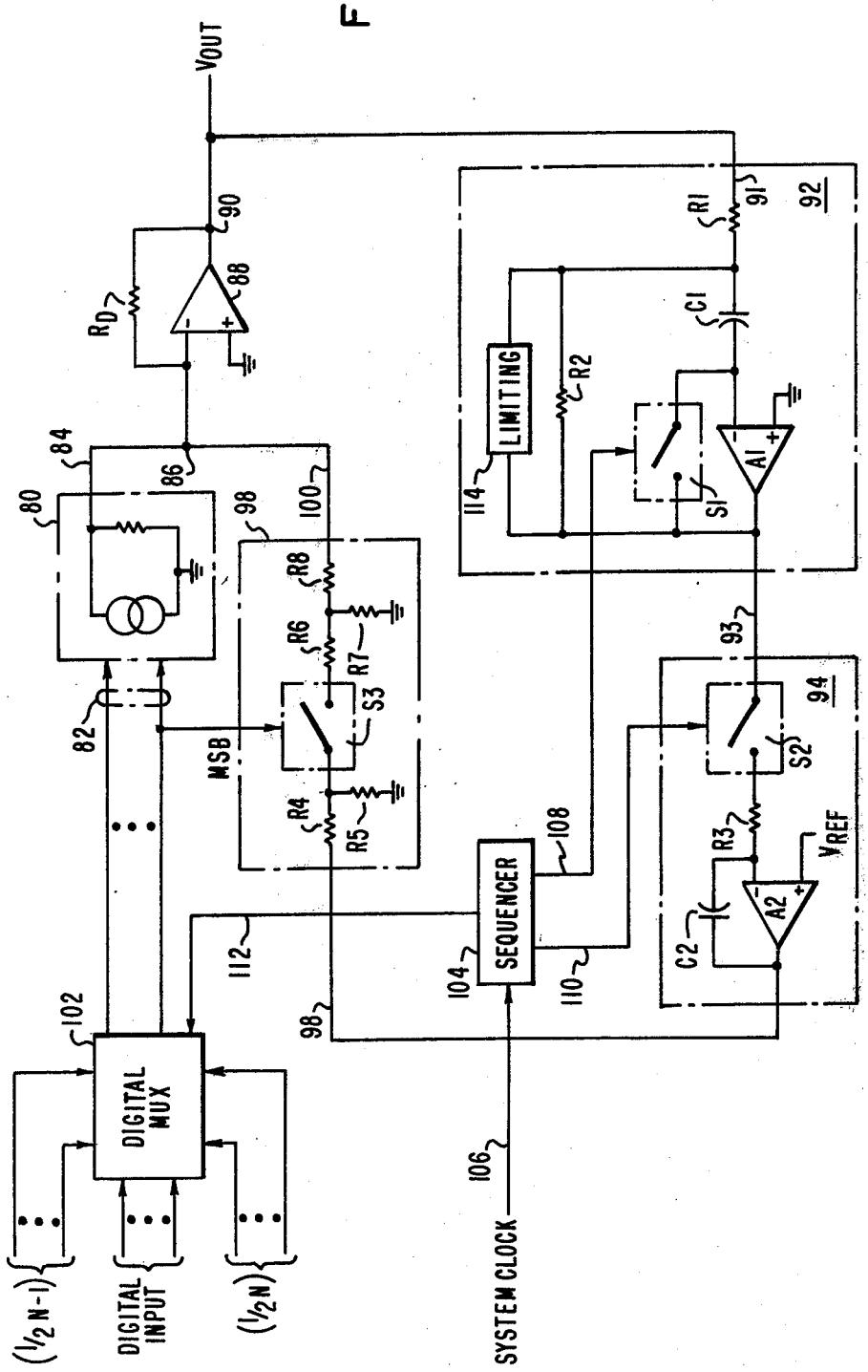
FIG. 4 depicts a schematic block diagram of a D/A converter suitable for embodying one aspect of the present invention and in addition, suitable for use in a successive ranging A/D converter similar to the one shown in FIG. 1.

In accordance with one aspect of the present invention, a digital-to-analog conversion system having apparatus for self-compensating conversion inaccuracies especially those associated with linearity is exhibited illustratively in the block diagram schematic of FIG. 4. With the improvement in conversion transfer characteristics, the digital-to-analog converter embodiment of FIG. 4 is suitable for use in a successive ranging analog-to-digital converter such as the embodiment shown in FIG. 1, for example. Referring to FIG. 4, a conventional current output type digital-to-analog converter is functionally represented by the block 80. The converter 80 is responsive to a digitally coded input word 82 to generate a current signal over line 84 representative thereof. The current signal over line 84 may be coupled to a current summing junction 86 of a conventional operational amplifier 88. The amplifier 88 may be configured with a resistor $R_D$ coupled across the summing junction 86 and its output 90 to effect a voltage $V_{OUT}$ at the output 90 which is proportional to the net current summed at the summing junction 86.

The self-compensating apparatus of the present embodiment may include a sample/differencing circuit 92 a time-gated integrator circuit 94, and another current source 98. For example, the sample-differencing circuit 92 may have its input 91 coupled to measure differences in the voltage output signal at 90. In turn, the circuit 92 may be coupled in cascade over line 93 to the time-gated integrator circuit 94, the output signal 96 of which may be used to govern the other current source 98 to generate another current signal over line 100 which may be summed at the current summing junction 86, but only at times when a predetermined code appears over the digital input lines 82. In the present embodiment, the converter 80 may be responsive to digital words having a binary code with their bits ordered in significance. In this case, one of the bits, like the most significant bit, for example, may be chosen to operate the time-gated current source 98 to permit current to flow into the summing junction 86 over line 100 only at times when the most significant bit is activated or logically true (i.e. a "one").

Further included as part of the self-compensating operation in the embodiment of FIG. 4 may be a conventional digital multiplexer shown at the block 102 which may be operative at predetermined times for causing the digitally coded input signal over liness 82 to switch between a predetermined pair of consecutive digital codes to render a corresponding transitional difference in the voltage output signal at 90. For example, if it is assumed that the digital input word has a maximum count of N−1, then the preferred pair of consecutive digital codes may be represented by (N/2)−1 and N/2. In the present embodiment the self-compensating apparatus may further include a time sequencer 104 governed by a system clock signal 106 which may be derived by another system, preferably one like the successive ranging analog-to-digital conversion system as shown in FIG. 1, which may be utilizing the digital-to-analog conversion characteristics of the embodied conversion system. The sequencer 104 may be operative in response to the governing signal 106 to control the operation of the circuits 92, 94 and 102 in a timely fashion by generating appropriate timing signals over lines 108, 110 and 112, respectively.

In greater detail, the sample/differencing circuit 92, as shown in the embodiment of FIG. 4, may include a conventional operational amplifier A1 having an inverting (−) and non-inverting plus (+) input and an output which is coupled to line 93. An analog switch, denoted by the block S1, may be coupled between the (−) input and output of the operational amplifier A1. The analog signal output at 90 may be coupled to one end of a resistor element R1 which in turn may be coupled in series to another resistor element R2, the other end of R2 being coupled to the output of amplifier A1. A capacitive element C1 may be coupled between the inverting input of A1 and the series connection of resistors R1 and R2. As is typically the case, a limiting network as shown at 114 may be disposed across the amplifier A1 for circuit protection purposes.

Moreover, the time-gated integrator 94, in detail, may include another operational amplifier A2 with inverting (−) and non-inverting (+) inputs and an output which is coupled to line 96. Disposed across the noninverting input and output of the amplifier A2 is a second capacitive element C2. Another resistor element R3 may be included with one end connected to the (−) input of A2 and another end connected to a conventional analog switch as denoted by the block S2. The other end of the switch S2 may be coupled to the circuit 92 over line 93. The switches S1 and S2 of the circuits 92 and 94, respectively, may be controlled in their opening and closing operation by the timing signals 108 and 110, respectively as generated by the sequencer 104. A voltage reference potential, which may be of a value representative of the analog equivalent of 1LSB, may be supplied to the (+) input of the amplifier A2.

Further disposed in the present embodiment at the input of the current source 98 may be a series resistor network, including resistor elements R4 and R5, to attenuate the signal level provided to the input over line 96. Also included, in the current source 98, is a third analog switch S3 having one end coupled to the series connection of resistors R4 and R5 and the other end thereof coupled to another series resistor network comprising resistors R6 and R7. The resistors R5 and R7 of the series networks may be each connected to a fixed voltage potential, like ground potential, for example. In operation, the analog switch S3 may be opened and closed in accordance with the activation of the selected bit of the digital input word from the lines 82, preferably the MSB. To convert the resulting voltage signal at the junction between R6 and R7 to a current signal, another resistor R8 is disposed between the line 100 and series conneton of resistors R6 and R7, thereby permitting a current signal proportional to the voltage at line 96 to flow through the line 100 to the summing junction at 86.

Figure 5:
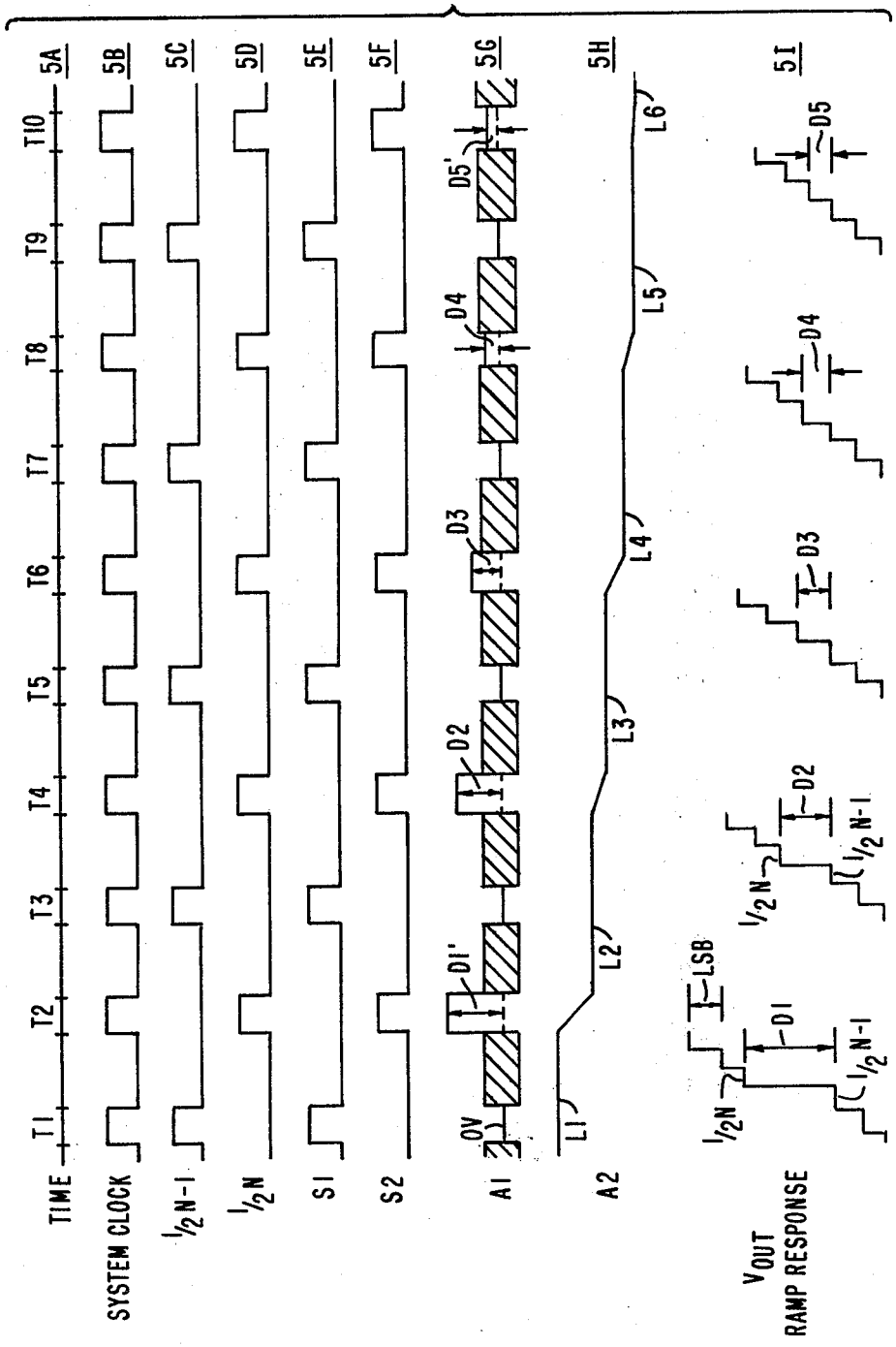
FIG. 5 depicts exemplary time waveforms 5A through 5I which are used to describe the operation of the D/A converter embodiment of FIG. 4.

A typical operation of the embodiment shown in FIG. 4 will be described in connection with a set of exemplary time waveforms as shown in FIG. 5. Referring to FIG. 5, the time waveform 5A designates various time intervals T1, T2, . . . T9 and so on which may be predetermined in accordance with some hierarchy or in coordinated with some cooperating system. For the case in which the D/A converter is embodied in an A/D conversion system, like that shown at 40 in FIG. 1, the times T1, T2 . . . and so on may be considered as the times during which the A/D conversion system is inoperative. These times are commonly referred to as dead times. In this operational mode, the self-compensating operations of the D/A converter, as described in connection with FIG. 4, may occur without hindering the normal timely operations of the D/A converter 40 as utilized by the A/D conversion system. For the purposes of controlling the self-compensating apparatus, the system clock signal 106 may be so designed as to have pulses occurring at the predetermined time intervals T1, T2 . . . T9, etc. as shown by the waveform 5B.

Accordingly, then, in one example of operation the sequencer 104 may control the digital multiplexer 102 utilizing line 112 to interrupt the input digital signal from controlling the D/A converter 80 and introduce the first of a pair of consecutive digital input words at time T1. Preferably, the first word of the pair may be denoted as $(N/2)-1$ which for a binary coded digital word will be represented by a "zero" in the most significant bit (MSB) and all "ones" for the remaining bits of the word. During this same time interval T1, the sequencer 104 may also control switch S1 to a closed or shorted condition using line 108. With the (+) input of the amplifier A1 at a reference level, which may be considered substantially at ground level, the output of the amplifier A1 will be forced to ground because of the high gain characteristics thereof. Under these conditions, the capacitive element C1 will become appreciably charged almost to its capacity by the analog output signal at 90 utilizing resistors R1 and R2.

During the time between T1 and say another predetermined time T2, the D/A converter is permitted to perform its normal conversion duties. However, at the predetermined time T2, the normal operation of the D/A converter may be interrupted and the second digital input word of the consecutive pair, preferably denoted as (N/2) or a "one" in the MSB and "zeros" in the remaining bits of the word, may be switched by the multiplexer 102 to the control lines 82 as governed by the sequencer 104 using signal line 112. Accordingly, the elemental D/A converter unit 80 will respond by rendering an analog signal at 90 representative thereof. Now, because the capacitive element C1 was previously charged with the analog output signal representative of the coded word $(N/2)-1$ during the predetermined time T1, then at time T2, the amplifier A1 may respond, because of the circuit configuration of 92, by generating a voltage difference level D1′ at its output as shown in time waveform 5G. Thus, the corresponding transitional difference in the analog output signal at 90 between the pair of consecutive digital input words $(N/2)-1$ and N/2, which is denotd as D1 in the time waveform of 5I, may be measured and a signal D1′ representative thereof may be generated by the circuit 92 during the time T2. Concurrently, the sequencer 104 may operate the switch S2 in circuit 94 to a closed position using signal line 110 for a prespecified time interval as may be designated by the system clock. During this prespecified time interval at the predetermined time T2, the integrator circuit 94 is permitted to integrate in response to the signal level of the output of the amplifier A1 as conducted thereto over the line 93 and the voltage reference potential $V_{REF}$ applied to the (+) input of the amplifier A2. As a result, the output of the amplifier A2 may change from a level, say L1, to a new level L2 such as that shown in the time waveform 5H at time T2.

In turn, the new output level L2 of the time-gated integrator circuit 94 may be used to govern the current source 98 to generate a compensating current which may be supplied to the summing junction 86. The purpose of this compensating current signal will be more fully understood from the brief description here to follow. Under normal operation, it is expected that the D/A converter element 80 is expected to respond to a ramped transitional increase of the digital input signal submitted thereto over lines 82 with a staircase analog output signal at 90 wherein each of the analog output signal differences is expected to be within the $\pm \frac{1}{2}$LSB as described in connection with the exemplary waveforms of FIG. 3 hereabove. However, going through transitional points, such as the transition through the consecutive pair of digital input words $(N/2)-1$ and N/2, a linearity difference of somewhat greater than the specified requirements may result. This is shown by the denoted difference D1 in the illustrative waveform of 5I between the times T1 and T2. The transitional resulting difference D1 may be possibly as much as 3 quanta in error, for example. Thus the generated signal D1′ at the output of A1 may be representative of this 3 quanta error rendered at the most significant bit transition point. The time-gated integrator circuit 94 responds to the generated measured signal D1′ by integrating to a new level say from L1 to L2 during the prespecified time interval at T2. The new signal level L2 is then used to govern the amount of current generated in 98 to eventually compensate for the transitional error described supra.

It is understood that the integrating circuit 94 may not have enough time in one of its prespecified interval to integrate to a signal level which provides the necessary compensating current to completely alleviate the linearity error of the aforementioned transitional point. For this reason, the operation may be repeated during subsequent predetermined times to complete the self-compensating process. For example, at the predetermined time T3, the desired input word (N/2)−1 may again be input to the D/A converter element 80 with switch S1 being concurrently closed as shown by the waveforms 5C and 5E. Subsequently, at a subsequent predetermined time T4, the desired digital input word N/2 may again be input to the D/A converter element 80 and the switch S2 may be closed concomitantly therewith. As a result of the previously generated compensating signal, there generally will exist a new difference D2 at the transitional point in the compensated analog output signal at 90. The circuit 92 may measure this new difference D2 and generate a signal D2' representative thereof. Responsively, the integrator circuit 94 integrates to a new control level L3 which is used to govern the current source 98 to generate a compensating current commensurate therewith. As a result of the newly derived compensating current in accordance with the integrating level L3, the difference in the output signal at 90, for the transition between the digital words (N/2)−1 and N/2, may be reduced as illustrated by the difference D3 in the waveform 5I between the times T5 and T6. However, the new difference D3 may still be greater than that desired for the linearity specifications of the D/A converter unit 80.

Accordingly, this compensation process may be repeated through the subsequent pairs of predetermined times T5, T6; T7, T8; and T9, T10 during which times the circuit 92 measures the transitional analog output differences D3, D4 and D5 and generates respectively signals D3', D4' and D5' representative thereof. In response to these generated signals, the integrator circuit 94 integrates through levels L4, L5 and L6 at which time the levels of integration become almost indistinguishable, thus indicating a stabilized conversion to a compensating current which provides substantially for a staircase analog output signal at 90 which is linear through the most significant bit transitional point to the desired specifications (refer to waveform 5I between times T9 and T10). In so doing, the self-compensating circuitry has removed substantially the linearity inaccuracies of the D/A converter element 80 primarily caused by the most significant bit transition in the ramped response.

Incidentally, the hashed line area in the time waveform 5G of FIG. 5 denotes outputs of the amplifier A1 in circuit 92 which are undefined for the purposes of the present description.

It is understood that the present invention need not be limited to an embodiment which only compensates for linearity at the most significant bit transition point, nor is it limited to any embodiment which limits the self-compensation circuit to compensating for only one transition point in the digital-to-analog conversion code sequence, but may be extended to compensate as many transition points in the digitally coded input word sequence as are felt necessary. For example, for a binary coded input word the self-compensating inventive principle may not only compensate for the transition point at the most significant bit, but may be extended to the transition points of the next most significant bit and the third most significant bit as well as exemplified by the schematic block diagram embodiment shown in FIG. 6.

Figure 6:
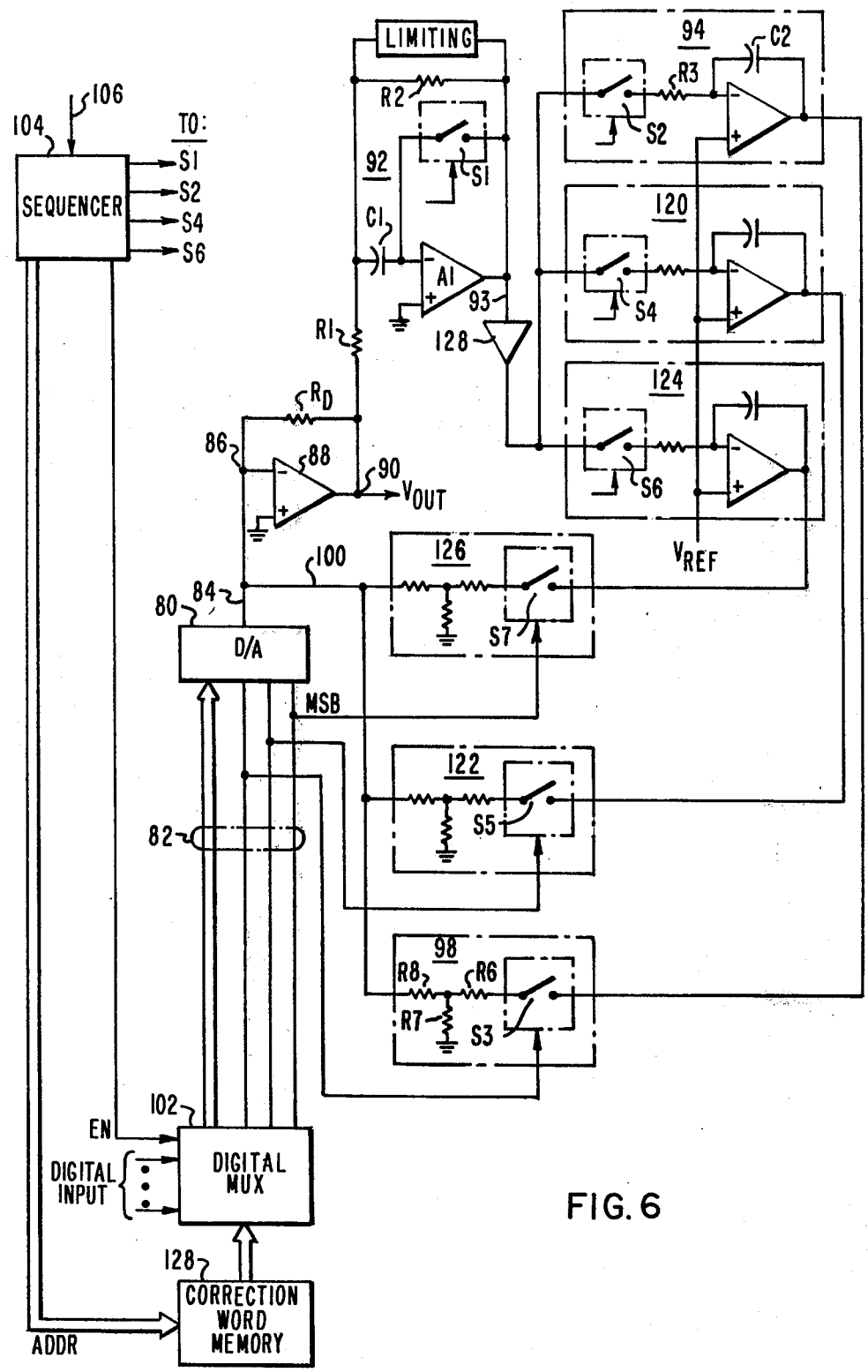
FIG. 6 depicts a schematic block diagram of a D/A converter suitable for embodying another aspect of the present invention in which self-compensation may be accomplished for a plurality of transition points in the D/A conversion code sequence.

In the embodiment exhibited in FIG. 6, another time-gated integrator circuit 120 and time-gated current source 122 may be added to the embodiment of FIG. 4 and be operative in relation to the next most significant bit transitional point in the binary coded word input sequence. Still further, a third set including a time-gated integrator circuit 124 and time-gated current source 126 may also be disposed in the extended embodiment and be operative in relation to the third most significant bit transitional point of the binary coded word input sequence. A random access memory or read-only memory exhibited at block 128 may be additionally included for the purposes of storing the three pairs of consecutive digital codes which may be (N/2)−1, N/2; (N/2$^2$)−1, N/2$^2$; and (N/2$^3$)−1, N/2$^3$. The sequencer 104 may additionally be expanded to include conventional logic circuitry to control the time-gated switches S4 and S6 disposed in the time-gated integrator circuits 120 and 124, respectively. The time-gated switches S5 and S7 operating the current sources 122 and 126, respectively, may be governed by the state of the next most significant bit and third most significant bit, respectively.

Furthermore, the sequencer 104 may include additional digital logic circuitry for addressing the memory 128 to access the desired digital words of the consecutive pairs in accordance with the self-compensation operation of the D/A converter embodiment, of FIG. 6. For example, an enable signal EN may be supplied by the sequencer 104 to the digital multiplexer 102 to govern its operation in selecting one of the two sets of digital inputs to govern the conversion operation of the D/A converter element 80. Moreover, the circuit configuration of the additional time-gated integrator circuits 120 and 124 may be much the same as that of circuit 94 and similarly, the circuit configuration of the time-gated current sources 122 and 126 may also be similar in configuration to that of circuit 98. A voltage reference signal $V_{REF}$ may be adjusted to some predetermined value, say approximately around 1 quanta or one least significant bit, for example, and be supplied to the non-inverting (+) inputs of the operational amplifiers of the integrator circuits 94, 120 and 124 simultaneously. The remaining circuitry of the embodiment as shown in FIG. 6 remains much the same as that described in connection with the embodiment of FIG. 4 except that a buffer amplifier may be added between the common input of the plurality of time-gated integrators 94, 120 and 124 and the output of the circuit 92, the buffer amplifier being enumerated as 128.

Figure 7:
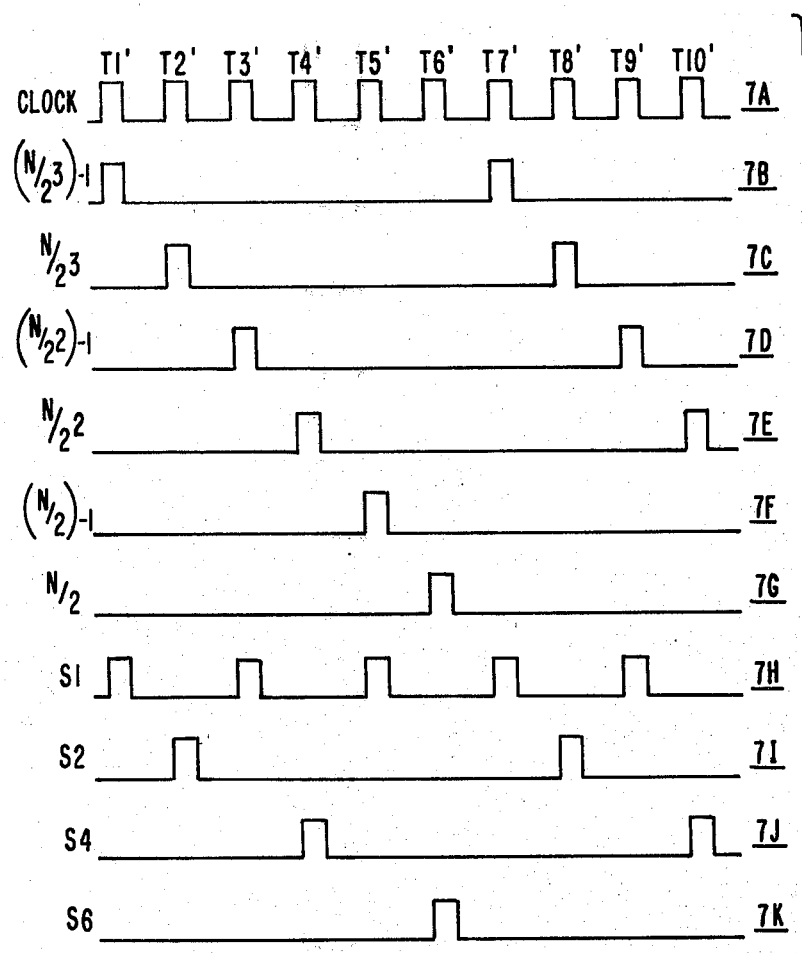
FIG. 7 exhibits exemplary time waveforms 7A through 7K which are used in the specification for describing the operation of the alternate embodiment depicted in FIG. 6.

A description of one possible mode of operation of the embodiment described in connection with FIG. 6 is provided herebelow in connection with the time waveforms 7A through 7K of FIG. 7. As with the embodiment of FIG. 4, time may be divided into a number of predetermined times T1', T2' . . . T10' and associated with each predetermined time is a prespecified time interval. A clock signal having the characteristics of waveform 7A may be provided to the sequencer 104 over signal line 106. At the predetermined time T1', the sequencer 104 may cause the digital multiplexer 102 to switch from governing the D/A converter 80 with the digital input to governing the converter 80 with the output word from the memory 128. This is accomplished by the status of the signal line EN. The word accessed from memory 128 may be identified by the address supplied from the sequencer 104 over address lines denoted as ADDR. At time T1, for example, the address over the lines ADDR may access a digital input word having the binary code representative of $(N/2^3) - 1$, N being the max binary code of the input digital words. Concurrently, the switch S1 of circuit 92 may be operated closed by the sequencer 104, allowing the capacitive element C1 to become charged.

At the next predetermined time T2, the selection of the digital multiplexer 102 may be similarly switched to access another binary coded word from memory 128 to govern the conversion of the D/A converter 80. This second word may have a binary code representative of $N/2^3$. During the prespecified interval at T2', the sequencer 104 operates switch S2 closed to allow the integrator circuit 94 to integrate to a new compensating level which governs the amount of current produced by the current source 98. Since switch S3 is operated closed with the binary code of $N/2^3$, the compensating current from circuit 98 will be summed at the summing junction 86.

At the next predetermined time T3, the binary coded word representative of $(N/2^2) - 1$ may be accessed and selectively provided to the D/A converter 80 to render a resulting analog output signal corresponding thereto at the output point 90. With switch S1 closed at time T3', the capacitive element C1 will again be charged accordingly. Next, at the time T4', the digital word having a binary code representative of $N/2^2$ may be accessed and selectively supplied to the converter 80 to render a difference signal at the output of the amplifier A1 at 93. Simultaneously, switch S4 is operated closed by the sequencer 104 using the appropriate signal line and the integrator 120 may respond to the difference signal at 93 for the prespecified time interval at time T4' to generate another compensating signal to govern the current source 122. Hereagain, with the digital binary code $N/2^2$ provided over the digital lines 82 the switch S5 in the current source 122 is operated closed thus allowing the compensated current of circuit 122 to flow to the summing junction 86.

At the next predetermined time T5', the binary coded digital word representative of $(N/2) - 1$ may be accessed from the memory 128 and selectively switched to the input of the D/A converter 80 by the multiplexer circuit 102 in accordance with control signals supplied from the sequencer 104. In addition, analog switch S1 of circuit 92 may be closed such that the capacitive element C1 is charged in accordance with the analog output signal at 90 which is the conversion of the digitally coded word $(N/2) - 1$. Successively, at time T6', the digitally coded word representative of N/2 may be similarly provided to the input of the converter 80 and cause both of the outputs of amplifiers 88 and A1 to respond by generating associated difference signals in accordance therewith. At T6', the analog switch S6 of the integrator 124 may be controlled to close by the appropriate signal supplied by the sequencer 104 for the prespecified interval. During this interval, the integrator 124 integrates the buffer signal from A1 to render a compensating signal which governs the current 126. With analog switch S7 of circuit 126 closed, the generated compensating current may be supplied over line 100 to the summing junction 86 to be added with the ouput current of the D/A converter element 80. This self-compensating procedure may be repeated again, if necessary, or under direct control, at the subsequent predetermined times T7', T8', T9' . . . etc. It is understood that the above operational example is but one mode under which the embodiment described in connection with FIG. 6 may be operated and is used herein merely for descriptive purposes.

Figure 8:
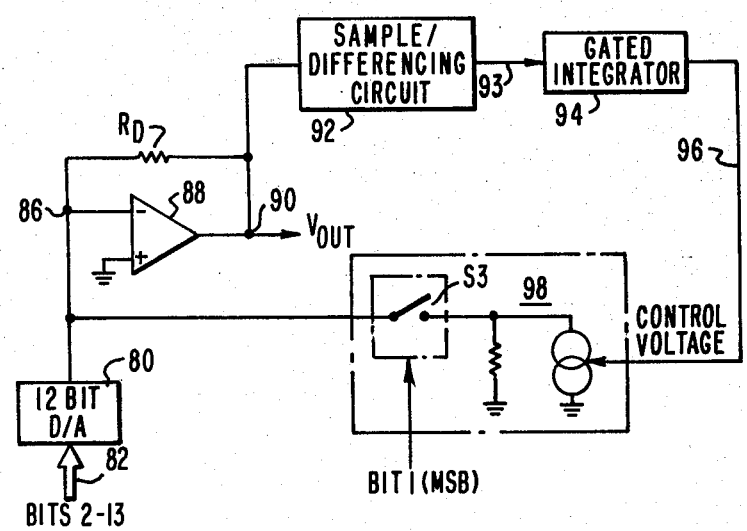
FIG. 8 is a schematic block diagram of an N-bit D/A converter including circuitry for expanding the conversion resolution to at least one more bit, the overall circuitry being suitable for embodying still another aspect of the present invention.

In still another embodiment of applicants' inventive principles, the resolution of a conventional off-the-shelf D/A converter unit may be extended by at least one bit, thus doubling the resolution thereof. An example of such an embodiment is shown in the block diagram schematic of FIG. 8. The D/A converter unit 80, amplifier 88, sample/differencing circuit 92, gated integrator 94, and time-gated current source 98 all remain substantially in a similar circuit configuration as that described in connection with the embodiment of FIG. 4. However, the digital input lines 82 which may contain 12 bits, for example, may be supplied primarily to the converter 80 and not used to control the time-gated current source 98 as was the case in the previously described embodiments of FIGS. 4 and 6 hereabove. In the present embodiment, another bit which may be considered the most significant bit of a 13-bit code may be utilized to control the time-gated current source 98. In the present example of FIG. 8, it may be assumed that the current range of the converter 80 may be from 0 to 5 milliamperes and the current source 98 may be governed around the quiescent current value of 5 milliamperes in accordance with the signal line 96 provided by the integrator 94. Thus a total current range at the summing junction 86 may be, for the present case, $(-)$ 5 milliamps to $(+)$ 5 milliamps. Accordingly the output voltage range at 90 of the amplifier 88 may be scaled as a function of the value of the feedback resistor $R_D$.

In operation then, the converter 80 may be switched to its maximum output signal at times when the most significant or 13th bit is a zero utilizing similar circuitry to that described in connection with the embodiment of FIG. 4. Similarly the switch S1 (not shown) of circuit 92 may be closed allowing the capacitor C1 therein to be charged in accordance with the output analog signal at 90. Subsequently, the converter 80 may be caused to be switched to its minimum output signal and the 13th bit may be activated. Just as described before, a difference signal will result at 90 and be measured by the circuit 92 which in turn will generate a signal over line 93 representative of this measured difference. The gated integrator circuit 94 may integrate the generated signal over line 93 for a prespecified time interval to generate the signal over line 96 which governs the current output of the source 98. With the switch S3 closed, this auxiliary current is added to the output current of the converter 80 at the summing junction 86 to produce a composite output signal at 90. These two steps may be repeated for as many times as are needed to reduce the difference signal at the transition of the most significant bit or 13th bit to that desired. In so doing, a 12-bit D/A converter may be extended to a 13-bit D/A converter, thereby doubling the resolution thereof.

Figure 9:
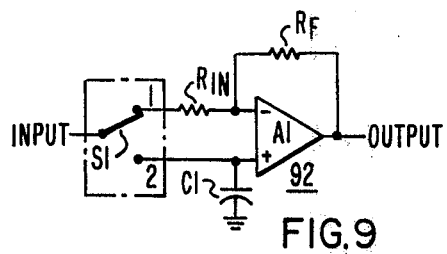
FIG. 9 is a circuit schematic of an alternate embodiment for the sample/differing circuit suitable for use in the D/A converter circuits.

While the sample/differencing circuit 92 has been described in connection with the embodiments of FIGS. 4 and 6 with a preferred circuit configuration, it is understood that other circuit configurations such as the ones shown in FIGS. 9 and 10 may be used as suitable alternatives under certain circumstances. Referring to the first alternate embodiment of 92 as shown in FIG. 9, a single-pole-double-throw switch S1 may be disposed at the input of the circuit. One position of the switch S1 may be coupled to an input resistor denoted as $R_{in}$, the other end of which being coupled to the (−) input of an operational amplifier A1. The other position of the switch S1 may be coupled to the (+) input of the operational amplifier A1. A capacitive element C1 may be coupled from the (−) input to a reference potential, preferably zero potential. A feedback resistor, denoted as $R_F$, may be coupled between the (−) input and output of the operational amplifier A1. In operation, the switch S1 may be switched to the other position to permit the capacitive element C1 to be charged accordingly. Subsequently, switch S1 may be returned to one position to measure and generate a difference signal at the output of the operational amplifier A1.

Figure 10:
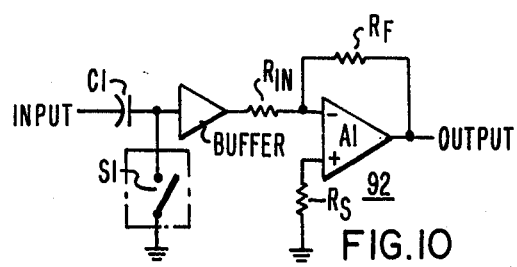
FIG. 10 is a circuit schematic of another embodiment of a sample/differencing circuit which is also suitable for use in the D/A converter circuits.

Referring to FIG. 10, the second alternative embodiment of the circuit 92 may include a capacitive element C1 having one end tied to the circuit input and the other end tied to the input of a buffer amplifier. The analog switch S1 may be coupled from the input of the buffer amplifier to a reference potential, preferably zero potential. The output of the buffer amplifier may be coupled to a conventional inverting amplifier A1 circuit configuration having a closed loop again given by the resistor ratio $R_F/R_{in}$. A resistor $R_S$ may be coupled from the (+) input of the amplifier A1 to ground potential. In operation, the switch S1 may be closed to permit the capacitive element C1 to be charged in relation to the analog output signal representative of the first of the pair of consecutive digital input words. Thereafter, the switch S1 may be opened to provide for a difference signal at the output of amplifier A1 representative of the transitional difference as the digital input word is switched to the second digital code of the pair.

In accordance with another aspect of the present invention, apparatus may be included in a successive ranging A/D converter of the type similar to the one described in connection with FIG. 1 for dynamically reducing offset errors which may exist because of the various gain ranging conversion paths or as a result of the input or A/D conversion circuitry thereof. The reduction in the offset errors is believed to ultimately improve the conversion transfer characteristics of the A/D successive ranging conversion system.

Figure 11:
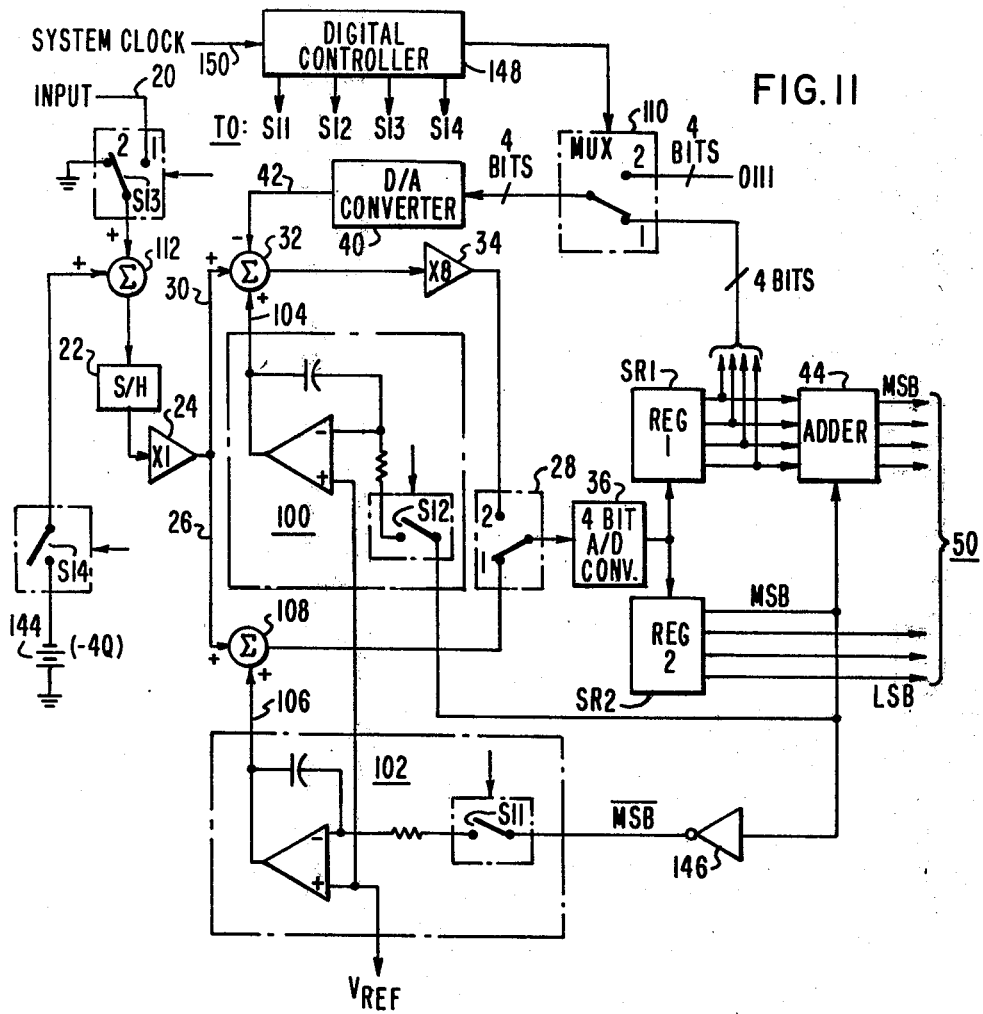
FIG. 11 is a block diagram circuit schematic of a successive ranging A/D conversion system including apparatus for dynamically reducing offset errors in accordance with another aspect of the present invention.

A block diagram schematic of an embodiment suitable for describing the principles of the present invention is found in FIG. 11. The embodiment exhibited in FIG. 11 is a successive ranging analog-to-digital conversion system including at least two analog range conversion paths 26 and 30 coupled commonly to an analog input signal 20, each path having a gain respectively associated with the conversion range thereof. For example in path 30, the associated gain is implemented with the amplifier 34 and, for the present embodiment, is adjusted to have a gain of 8. An analog-to-digital converter 36 is also included for sequentially converting each of the gain ranged analog signals of the conversion paths 26 and 30, for example, with the cooperation of the analog multiplexer switch 28 to form sequentially resulting digitally coded words respectively corresponding to each of the conversion paths, each resulting word having a predetermined number of significantly ordered bits. For the present embodiment, each of the conversion words may have four bits and may be stored in the registers SR1 and SR2. That is the conversion word of the path 26 may be stored in the register SR1 and the conversion word for the path 30 may be stored in the register SR2.

While the present embodiment includes only one A/D converter circuit, it is understood that an alternate embodiment may include more than one A/D converter, possibly one for each conversion path such that the A/D conversions may be performed concurrently instead of sequentially. This modification will in no way deviate from this aspect of the present invention.

Further included in the successive ranging A/D conversion system is at least one feedback path including a digital-to-analog converter 40 which may be of the type similar to that described hereabove in connection with the embodiments of FIGS. 3 and 5 and, furthermore, may be used to convert the digital code of the register SR1 to an analog signal which is conducted along path 42. The resulting feedback analog signal of path 42 may be subtracted from the analog input signal of path 30 in the summer 32 to effect a difference analog signal which is adjusted in range according to the gain of the amplifier 34 to form the gain ranged analog signal associated with path 30.

A digital circuit means, say for example, a digital adder like the one shown in the block 44, for example, may be utilized for combining the resulting digitally coded words of the conversion paths with a one bit overlap to form a composite digitally coded output word at 50 which is the approximate quantized digital equivalent of the analog input signal 20.

In accordance then with this second aspect of the present invention, two time-gated integrator circuits 100 and 102 both being responsive to the digital code of the resulting conversion word of the second conversion path 30 (i.e. the output of the storage register SR2) and operative to generate respectively first and second compensating signals 104 and 106. The first compensating signal 104 may be added to the second conversion path 30 through an input of the analog summer 32 and similarly, the second compensating signal 106 may be added to the common analog input of the conversion path 26 utilizing another analog summer 108 which is disposed in the conversion path 26. The addition results of the adders 32 and 108 may be coupled to the positions 2 and 1 of the analog multiplexer switch 28, respectively.

In addition, a digital multiplexer 110 which functions as a single-pole-double throw switch for each bit of a digital code may be disposed in the at least one feedback path between the D/A converter 40 and the storage register SR1. The digital switch 110 may be operative to render the at least one feedback path inoperative when in position 2 and at the same time, introduce a fixed resultant conversion signal as the analog subtracting signal. Accordingly, while in position 1, the feedback path is rendered operative.

The embodiment further includes two additional switching devices S13 and S14 disposed at the input of the A/D conversion system for adding first and second reference signals to the analog input signal 20 utilizing another analog adder 112. More specifically, the analog switch S13 may have a first position coupled to the analog input signal and a second position coupled to the first reference signal which is preferably at ground potential. The pole position of the switch S13 may be coupled to one input of the analog summer 112. Moreover, the analog switch S14 may be a single throw functional switch having its position coupled to a signal source 144 capable of producing the second reference voltage which for the present embodiment may have a value representative of −4 quanta with respect to the scaling of the analog input signal 20. The pole position of the switch S14 may be coupled to a second input of the analog summer 142. The resulting analog summation of 142 may then be input to the sample-and-hold circuit 22 and thereafter, distributed to the conversion paths 26 and 30 in a conventional manner.

Still referring to the embodiment of FIG. 11, the time-gated integrators 100 and 102 may be of a conventional analog circuit configuration wherein a capacitive element is bridged across the inverting input and output of an operational amplifier. The current is scaled by an input resistor tied also to the inverting input of the operational amplifier. Analog switches S11 and S12 are included in the circuits 102 and 100, respectively, for allowing the integrator circuits to be responsive to the analog input signals coupled thereto. In the present embodiment, the most significant bit of the output word of register SR2 is coupled directly to the input of the analog switch S12 of the time-gated integrator circuit 100 and is invertedly coupled to the analog switch S11 of the circuit 102, the inversion of the MSB being accomplished by a simple digital inverter as shown at 146. Moreover, the non-inverting inputs of the operational amplifiers of the circuits 100 and 102 may be commonly coupled to a voltage reference level, preferably adjusted to a midrange potential between the binary voltage levels of the most significant bit.

While the present embodiment is described using analog type integrators, it is understood by those skilled in the pertinent art that integrators of the digital variety may also be suitable for performing the integration function without deviating from this aspect of the present invention. A digital integrator, alternately suitable for use in the embodiment of FIG. 11 as the integrator circuits 100 and 102, may include a clock circuit and a counter operative to the clock pulses up or down in response to the binary state of the MSB of the second conversion word, and further includes a D/A converter governed by the digital output of the integrator counter to effect the respective analog compensating signal.

In operation, some digital time controller may be used to coordinate the various switching elements in the conversion system. For these purposes, a digital controller 148 may be further disposed in the conversion system and may be governed by a system clock signal 150. The time controller 148 may include various conventional digital logic circuits for generating the various timing signals appropriately coupled to the switches S11 through S14 and the multiplexer switch 100 denoted as MUX. While the specific details of the digital controller 148 are not shown in FIG. 11, it is assumed that one skilled in the art will be capable of designing such a circuit configuration once having a set of timing waveforms for the operation of the various switching elements. An example of such a set of timing waveforms are shown in the FIG. 12 as the waveforms 12A through 12F.

Accordingly, the time waveforms of FIG. 12 may be used to describe an exemplary operation of the conversion system embodiment of FIG. 11. For example, the system clock signal 150 may include a train of pulses such as that shown at 160 in the waveform 12A. These time intervals 160 may be indicative of a time when the conversion system may not be required to perform in an overall system, like a radar system, for example, in which it may be a functional element. For the dwell times 162 between the pulses 160, the conversion system may be requird to operate and therefore, not be in a proper state for compensation. Thus, it is desirable to perform the offset compensation steps during the pulse intervals 160 of the system clock signal 150 and permit the A/D conversion system to operate conventionally during the dwell times 162.

According to the time waveform 12B of FIG. 12, the analog switch S13 may be switched to its position 2 during the pulse periods of 160 and conversely then it may be switched to position 1 during the dwell times of 162. On the other hand, the analog switch S14 may be closed during alternative time intervals 160 as shown by the waveform of 12C. Interleaved with the operation of the analog switch S14, the MUX switch 110 may be operated to its second position during the time intervals 160 when switch S14 is left open. Moreover, switch S12 may be closed within the time intervals that the MUX switch 110 is operated in its second position and similarly, switch S11 may be operated closed when the switch S14 is operated in its closed position.

For the purposes of describing this second aspect of the present invention, a 4-bit A/D converter may be used for the conversion block at 36 whereby each of the storage registers SR1 and SR2 will contain 4-bit conversion words. In the present embodiment, the resulting 4-bit conversion words may be added with a one bit overlap, that is, the least significant bit of the first conversion word stored in SR1 is overlapped in the addition operation with the most significant bit of the words stored in register SR2. This overlap addition operation may be accomplished in the digital adder unit 44. The resultant word then at 50 contains 7 bits of digital code, preferably in a binary coded format. The A/D converter 36 may be of a bi-polar converter variety wherein all zeros on the output represent the most negative analog input and all ones at the output represent the most positive of the analog input signal.

To illustrate a calibration procedure which utilizes the offset compensation apparatus described supra, reference is made to Table I shown herebelow.

TABLE 1

| SR1 | SR2 | Analog Input | Digital Output |
|---|---|---|---|
| 1001 | | | 11111111 (Max. Code) |
| ↑ | MSB...LSB | | ↑ |
| | 0101 | | |
| 1000 | 0100 | +4Q | 1000101 |
| | 1011 | | 1000100 |
| | 1010 | Incr. | 1000011 |
| | a 1001 | ↑ | 1000010 |
| | 1000 | | 1000001 |
| | | — 0V | 1000000 |
| | 0111 | ↓ | 0111111 |
| | b 0110 | | 0111110 |
| | 0101 | Decr. | 0111101 |
| 0111 | 0100 | −4Q | 0111100 |
| ↑ | 1011 | | 0111011 |
| | 1010 | | 0111010 |
| | 1001 | | 0111001 |
| | 1000 | | 0111000 |
| ↑ | 0111 | | ↑ |
| | 0110 | | |
| | 0101 | | |
| 0110 | 0100 | | 0000000 (Min. Code) |

In the present example, to accomplish one part of the calibration procedure, it is desired to have the digitally coded output word switch equally between the binary codes 1000000 and 0111111 for an analog input of zero volts. As it turns out, if first conversion word, that is, the contents in register SR1, is maintained virtually at the binary code 0111 and if the binary codes of the second conversion word in SR2 are forced to switch between the binary codes 0111 and 1000 with zero volts at the analog input, then the addition of the two conversion words of SR1 and SR2 with the aforementioned one bit overlapped result in the desired output codes.

In more particular detail, as shown in FIG. 12, the analog switch S13 may be switched to its second position at time t1, with the analog switch S14 open circuited, thereby forcing zero volts as the analog input signal. Concurrently, the MUX switch 110 may also be switched to its second position thus forcing a subtracting analog signal representative of the digital code 0111, over line 42. Under these conditions, then, the output code is restricted to fall within the range denoted by the circled A in Table 1. Moreover, if the binary codes of the second conversion word in SR2 are centered about the analog input level of zero volts during the normal conversion processing, the most significant bit of the conversion word in SR2 is switched between the voltage potentials representative of a "one" and "zero" state substantially equally. In the present embodiment, this may be accomplished by utilizing the voltage potential of the most significant bit in the time-gated integrator circuit 100. So that under the conditions imposed on the conversion system during the time interval 160 starting at time t1, if switch S12 is closed for a prespecified interval as shown by the waveform 12E in FIG. 12, the time-gated integrator 100 will respond to generate the compensation signal 104 to a value which centers the codes of the second conversions about the analog input of zero volts.

More specifically, if during the interval 164, an offset error exists during the second conversion cycle and is positive, the conversion codes thereof will be predominantly ones as shown by the direction of the arrow in Table 1 denoted by a. The integrator 100 responds to the voltage potentials of the most significant bit, under these conditions, by generating a compensating signal at 104, which is negative with respect to the zero potential. To compensate for the positive offset error in the second conversion cycle, the generated signal 104 is added to the second range channel 30 at the summing junction 32. It is understood that total compensation may not be achieved in just one interval 164; therefore a similar calibration procedure may be performed at a subsequent time, say like t3, for example, as shown in the waveform 12D of FIG. 12 wherein switch 12 is closed for another interval as shown at 166.

Now, on the other hand, should the offset error in the second conversion cycle be negative with respect to zero potential, then the potential levels of the most significant bit of the second conversion word in the register SR2 will be predominantly representative of zeros as shown by the arrow direction denoted by b in Table 1. Then during the intervals like those shown at 164 and 166 of waveform 12E, the integrator 100 may integrate its compensating signal 104 to a positive calibration level to offset the negative potential offset error of the second conversion cycle. Under this exemplary calibration method, the offset errors imposed by the circuitry of the A/D conversion system may be reduced significantly for the second conversion cycle.

Now to complete the exemplary calibration procedure, the for errors in the first conversion path may be calibrated by positioning, the analog switches S13, S14, MUX, and S12 in the states as shown at time t2 in FIG. 12. For example, analog switch S13 may be positioned at 2 to sustain a ground voltage at the input. Analog switch S14 may be closed to allow the reference voltage of 144, which for the present example may be adjusted to −4 quanta, to ultimately yield a common analog input to the conversion paths 26 and 30 of −4 quanta. Moreover, the MUX switch 110 may be positioned at 1 to render the feedback path 42 operative. Under these conditions, then, the analog switch S11 may be closed for a prespecified interval like that shown at 168 in the waveform 12F of FIG. 12 rendering the integrating circuit 102 responsive to the inverted potential of the most significant bit of the digital conversion words of SR2.

Referring to Table 1, under these conditions, the conversion results of the analog signal from the first conversion path 26 should lie on the edge between the binary codes 0111 and 0110 (refer to the codes within the range denoted by the circled B). Here again, in order for there to be an ideal centering situation for the digital codes of the second conversions, the potentials of the most significant bit should be switching binarily between that which is representative of a zero and that which is representative of a one substantially equally. And, in addition, for the integrating circuit 102 to respond with the proper polarity to compensate for the offset errors in the first conversion cycle, the polarity of the most significant bit voltages must be inverted as is accomplished with the inverter 146. Thus the compensating signal 106 may be added to the analog signal of channel 26 utilizing the adder 108 to compensate, with the correct polarity, for any offset errors generated therein. Once again, it is understood that the integrator circuit 102 may not have time in the prespecified interval 168 to generate sufficient compensation to completely compensate for a generated offset error in the first conversion path. If this be the case, then in another prespecified interval, say at interval 170 as shown in the time waveform 12F at a subsequent time t4, the integration may be continued. That is to say, the integrating circuits 100 and 102 may be repeatedly operated to adjust their generated compensating signals 104 and 106, respectively, to continuously correct for the offset drifts which may occur with time and temperature in the conversion paths 26 and 30.

It is understood that the description in connection with the embodiment of FIG. 11 was presented hereabove to illustrate a second aspect of the present invention and in no way should be considered limiting. That is to say, additions and modifications to the conversion system may take place without deviating from the principles of the present invention. For example, an alternate embodiment of the conversion system which employs an 8-bit A/D converter at 36 is shown in FIG. 13. In this embodiment, the resulting converted words stored in registers SR1 and SR2 are combined at the output by digital addition with a two-bit overlap. The most significant and next most significant bits of the conversion words of SR2 are supplied to the adder 44 to be added respectively to the inverted next least significant and least significant bits of the conversion words of SR1 resulting in a 14-bit digitally coded output word at 50.

In this embodiment, because of the associated relatively high gain of $2^6$ or 64 associated with the second conversion path 30, both conversion paths may be attenuated by a gain of 0.6. For this purpose, an attenuator 174 is disposed in the conversion path 26 and the gain of the amplifier 34 in the conversion path 30 is multiplied by 0.6 thus resulting in a gain of 38.4. Furthermore, the gain of the amplifier 34 in the second conversion path 30 is of a negative polarity with respect to the first conversion path 26. To correct for this polarity difference between conversion paths, a digital inverter 176 is provided at the output of the storage register SR1, thereby feeding back an inverted signal and providing an inverted signal to be added in adder 44. In addition, the digital bit inverter 146 is removed from the coupling path to analog switch S11 (see FIG. 11) and a new bit inverter 178 is provided in the coupling path from the most significant bit to the analog switch S12 in the circuit 100.

Furthermore, the second reference signal supplied by the source 144 through switch S12 may be adjusted to a quantity of 32 quanta. Also, the calibration reference word supplied to the MUX switch 110 at position 2 may be represented by the binary code 01111110. Once again, the timing of the switches as performed by a conventional digital controller (not shown) is similar to that shown by the time waveforms of FIG. 12.

Because of the inversion effects caused by the digital inverter 176 and the analog amplifier polarity inversion at 34, the composite digital output word at 50 is inverted. That is, for a most negative analog input signal, the output code may be all "ones" and for a most positive analog input signal the maximum output code may be all "zeros" wherein the most significant bit may change from one to zero as the analog input signal passes through zero potential.

An example of the operation of the modified embodiment of FIG. 13 is similar to that given above for the embodiment shown in FIG. 11. Reference may be made to Table 2 found herebelow which provides an exemplary illustration for a 5-bit embodiment of the modified configuration of FIG. 13, that is having an output addition at 44 with a double bit overlap. The use of a 5-bit example simplifies the tabulation illustration shown in FIG. 2. Accordingly, it would be an easy chore for anyone skilled in the pertinent art to extend the 5-bit illustrative example of Table 2 to one of 8 bits which is the operational capacity of the embodiment shown in FIG. 13.

TABLE 2

| Analog Input | SR1 (1st Conv.) | SR1 (INV.) | SR2 | Output |
|---|---|---|---|---|
| | | | (Min. Code) = | 11111111 ↓ |
| Decrease ↑ −4Q ↓ | 10000 → 01111 | 01111 01110 01101 01100 | | 10000111 10000110 10000101 10000100 |
| ↑ ↓ −0V | 10001 → 01110 | +E ↑ −E | 10011 10010 10001 10000 | Ⓑ 10000011 10000010 10000001 10000000 Ⓐ |
| Increase | Advance | ↓ | 01111 01110 | 01111111 01111110 |
| | | | 01101 01100 | 01111101 01111100 |
| | 10010 → 01101 | | 10011 10010 10001 10000 | 01111011 ↓ |
| | | | (Max. Code = | 00000000 |

In the example of Table 2, the digital output code advances in the downward direction wherein the minimum code is shown at the top of the Table and the maximum code is shown at the bottom. Taken together with the description for the operation of the embodiment of FIG. 11, it is believed the Table 2 is self-explanatory and may be understood by anyone skilled in the pertinent art. Therefore, no further description of operation is felt necessary.

Applicants have presented a number of embodiments hereabove to present their inventive principles in what they believe to be their best modes, however the various aspects of their invention should not be limited to any one embodiment but rather construed in connection with the breadth and broad scope of the claims heretofollow.

We claim:

1. A successive ranging analog-to-digital conversion system including at least two analog range conversion paths coupled commonly to an analog input of said system through which an analog input signal may be conducted commonly to each of said paths, each path having a gain respectively associated with the conversion range thereof; at least one analog-to-digital converter for converting each of the gain ranged analog signals of said conversion paths to form digitally coded words respectively corresponding thereto, each resulting word having a predetermined number of significantly ordered bits; at least one feedback path for subtracting the conversion results of said analog-to-digital converter for a first conversion path from the common analog input signal of a second conversion path to effect a difference analog signal which is adjusted in range in said second conversion path according to the gain thereof to form the gain ranged analog signal associated therewith; a digital circuit means for combining the resulting digitally coded words of the conversion paths to form a composite digitally coded output word which is the approximate quantized digital equivalent of the analog input signal; and apparatus for dynamically reducing offset errors of said system to improve the conversion transfer characteristics thereof, said apparatus comprising:

a first switching means coupled to the analog input of said system for introducing a first reference signal as said analog input signal at first predetermined times and a second reference signal as said analog input signal at second predetermined times;

a second switching means for rendering said at least one feedback path inoperative at said first predetermined times and concomittently subtracting the common analog input signal of the second conversion path with a fixed predetermined signal;

a first integrator circuit responsive to the digital code of the resulting conversion word of said second conversion path at said first predetermined times to generate a first compensating signal;

first circuit means for coupling said first compensating signal into said second conversion path;

a second integrator circuit responsive to the digital code of the resultant conversion word of said second conversion path at said second predetermined times to generate a second compensating signal; and second circuit means for coupling said second compensating signal into said first conventional path.

2. The A/D conversion system in accordance with claim 1 wherein the first reference signal is equivalent to a zero analog input signal; and wherein the second reference signal is based on the gain range of the second conversion path.

3. The A/D conversion system in accordance with claim 1 wherein the conversion code of the resulting digital words includes a most significant bit having a binary signal level state; and wherein the first and second integrator circuits are responsive to the binary state of the most significant bit of the resulting conversion words of the second conversion path at the first and second predetermined times, respectively, to generate their first and second respective compensating signals.

4. The A/C conversion system in accordance with claim 3 wherein the first integrator circuit includes a capacitive storage operational amplifier type integrator having a signal input, a reference input and an output; an analog switch operative during the first predetermined times to couple the binary signal levels of the most significant bit states of the resulting digital words of the second conversion path to the signal input of said operational amplifier type integrator; and a signal source, for supplying a reference signal with an approximate value midway between the signal levels of the binary states of said most significant bit to the reference input of said operational amplifier, said output of said operational amplifier type integrator being coupled to the first circuit means.

5. The A/D conversion system in accordance with claim 3 wherein the second integrator circuit includes a capacitive storage type operational amplifier integrator circuit having a signal input, a reference input and an output; an analog switch operative during said second predetermined times to couple the signal levels of the most significant bit of the resulting digital words of the second conversion path to the signal input of the operational amplifier type integrator; and a signal source for supplying a reference signal having a value approximately midway between the signal levels of the binary states of said most significant bit word to the reference input of said operational amplifier, said output of said operational amplifier being coupled to the second circuit means.

6. A digital-to-analog conversion system including apparatus for self-compensation of conversion inaccuracies, said system including:

a digital-to-analog converter circuit operative to convert a digitally coded input signal into an analog output signal representative thereof;

a first circuit responsive to said digitally coded input signal to add a compensating analog signal to said analog output signal to yield a compensated analog output signal;

a second circuit operative at predetermined times for causing said digitally coded input signal to switch between a predetermined pair of consecutive digital codes to render a corresponding transitional difference in said compensated analog output signal;

a time-gated amplifier circuit operative at said predetermined times for measuring said rendered transitional difference and generating an analog signal representative thereof; and a time-gated integrating circuit for integrating said generated analog signal for a prespecified interval at said predetermined times to generate said compensating signal.

7. The digital-to-analog conversion system in accordance with claim 6 wherein:

the second circuit includes a fourth circuit which is operative to cause the digitally coded input signal to switch between a plurality of predetermined pairs of consecutive digital codes to render a transitional difference for each of said predetermined pairs of said plurality, each predetermined pair of said plurality being switched at corresponding selected ones of the predetermined times;

the time-gated amplifier circuit is operative to measure each rendered transitional difference and to generate a plurality of analog signals respectively corresponding thereto;

the time-gated integrating circuit includes a time-gated integrator for each generated analog signal of said plurality, each integrator being operative to integrate the generated analog signal associated therewith for a prespecified interval of said corresponding selected predetermined times to generate a corresponding compensating signal; and the first circuit includes a plurality of analog switches coupled correspondingly to the outputs of said plurality of time-gated integrators and governed by the digital code of said input words of the converter circuit to selectively sum, at times, said generated compensating signals to the analog output signal of the converter circuit to yield the compensated analog output signal.

8. The digital-to-analog conversion system in accordance with claim 6 wherein the digital-to-analog converter converts binary coded input words into analog output signals representative thereof.

9. The digital-to-analog conversion system in accordance with claim 8 wherein the first circuit is responsive to the most significant bit of the binary coded input words to add the compensating signal to the analog output signal; and wherein the second circuit is operative to cause the binary coded input signal to switch between a binary coded word representative of one-half full scale minus one least significant bit and a binary coded word representative of one-half full scale to render a corresponding transitional difference in the analog output signal of the digital-to-analog converter at the predetermined times.

10. The digital-to-analog conversion system in accordance with claim 8 wherein:

the second circuit is operative to cause the binary coded digital input signal to switch between at least three pairs of consecutive binary coded words to render corresponding first, second and third transitional differences in the compensated analog output signal at first, second and third predetermined times, respectively;

the time-gated amplifier circuit is operative at said first, second and third predetermined times to measure the rendered first, second and third transitional differences to generate respectively corresponding first, second and third analog signals representative thereof;

the integrating circuit includes at least a first time-gated integrator circuit being operative to integrate said first difference signal for a prespecified interval at said first predetermined times to generate a first compensating signal, a second time-gated integrator circuit being operative to integrate said second analog signal for a prespecified time at said second predetermined times to generate a second compensating signal, and a third time-gated integrated circuit being operative to integrate said third analog signal for a prespecified interval at said third predetermined times to generate a third compensating signal; and the first circuit includes at least three times-gated analog switches responsive to the binary coded digital input signal to add selectively said first, second and third compensating signals to the analog output signal of the digital-to-analog converter.

11. The digital-to-analog conversion system in accordance with claim 10 wherein the second circuit includes circuitry to switch between the binary coded words representative of one-half full scale (F.S.) minus one least significant bit (LSB) and one-half F.S. at the first predetermined time, the binary coded words representative of one-fourth F.S. minus one LSB and one-fourth F.S. at the second predetermined times, and the binary coded word representative of one-eighth F.S. minus one LSB and one-eighth F.S. at the third predetermined time to render the first, second and third transitional differences respectively corresponding thereto.

12. The digital-to-analog conversion system in accordance with claim 11 wherein the at least three timegated analog switches of the first circuit respond respectively to the most, second most and third most significant bits of the binary coded digital input signal to add selectively the first, second and third compensating signals, respectively, to the analog output signal of the digital-to-analog converter.

13. The digital-to-analog conversion system in accordance with claim 6 wherein the time-gated amplifier circuit comprises:

an operational amplifier having an inverting and non-inverting input and an output said non-inverting input being coupled to a predetermined reference level;

first and second resistor elements having one end of each connected together, the other end of said first resistor element being coupled to the compensated analog output signal and the other end of the second resistor element being coupled to the output of said operational amplifier;

a capacitive element having one end connected to said inverting input of said operational amplifier and another end connected to the series connection of the first and second resistor elements; and an analog switch coupled between said inverting input and output of said operational amplifier and operative in accordance with the predetermined times.

14. The digital-to-analog conversion system in accordance with claim 13 wherein the analog switch is operative in a closed state to permit changing of the capacitive element and in an open state to provide at the output of the operational amplifier the analog signal which is representative of the transitional difference in the compensated analog output signal.

15. The digital-to-analog conversion system in accordance with claim 6 wherein the integrating circuit includes at least one time-gated integrator circuit comprising:

an operational amplifier having an inverting and non-inverting input and an output, said non-inverting input being connected to a predetermined reference level;

a capacitive element coupled between said inverting input and said output of said operational amplifier;

a resistive element having one end coupled to said inverting input of said operational amplifier; and an analog switch having one end coupled to said resistive element and another end coupled to said difference signal, said analog switch being closed during said prespecified intervals at said predetermined times.

* * * * *